United States Patent
Kalman et al.

(10) Patent No.: US 11,822,138 B2
(45) Date of Patent: Nov. 21, 2023

(54) INTEGRATION OF OE DEVICES WITH ICS

(71) Applicant: AvicenaTech Corp., Sunnyvale, CA (US)

(72) Inventors: Robert Kalman, Mountain View, CA (US); Bardia Pezeshki, Mountain View, CA (US); Cameron Danesh, Mountain View, CA (US); Alexander Tselikov, Mountain View, CA (US)

(73) Assignee: AvicenaTech Corp., Mountain View, CA (US)

( * ) Notice: Subject to any disclaimer, the term of this patent is extended or adjusted under 35 U.S.C. 154(b) by 0 days.

(21) Appl. No.: 17/497,742

(22) Filed: Oct. 8, 2021

(65) Prior Publication Data
US 2022/0113483 A1 Apr. 14, 2022

Related U.S. Application Data

(60) Provisional application No. 63/089,188, filed on Oct. 8, 2020.

(51) Int. Cl.
*G02B 6/43* (2006.01)
*G02B 6/42* (2006.01)
*H01L 25/16* (2023.01)

(52) U.S. Cl.
CPC .......... *G02B 6/43* (2013.01); *G02B 6/4214* (2013.01); *H01L 25/167* (2013.01); *G02B 6/4246* (2013.01)

(58) Field of Classification Search
CPC .......... G02B 6/12004; G02B 6/4214; G02B 6/4246; G02B 6/43; H01L 25/167
See application file for complete search history.

(56) References Cited

U.S. PATENT DOCUMENTS

| | | | |
|---|---|---|---|
| 4,616,247 A | 10/1986 | Chang | |
| 4,762,381 A * | 8/1988 | Uemiya | G02B 6/13 385/88 |
| 2004/0185386 A1 | 9/2004 | Block | |
| 2005/0224113 A1 | 10/2005 | Xue | |
| 2006/0249789 A1 | 11/2006 | Deliwala | |
| 2008/0111205 A1 | 5/2008 | Miura | |
| 2009/0115016 A1 | 5/2009 | Iwai | |

(Continued)

FOREIGN PATENT DOCUMENTS

| KR | 10-2014-0045381 A | 4/2014 |
|---|---|---|
| WO | 0229903 | 4/2002 |

OTHER PUBLICATIONS

International Search Reporton PCT Application No. PCT/US2021/054283 from International Searching Authority (KIPO) dated Feb. 4, 2022.

(Continued)

*Primary Examiner* — Michael P Mooney
(74) *Attorney, Agent, or Firm* — KOS IP Law LLP

(57) ABSTRACT

Optical interconnects for IC chips may include optical sources and receivers integrated with the IC chips. MicroLEDs may be mounted on an interconnect layer of the IC chip, and embedded within a waveguide. Photodetectors to receive light from the waveguide may be fabricated in a top surface of a semiconductor substrate, below a level of the interconnect layer, but with a passageway for light through the interconnect layer.

14 Claims, 16 Drawing Sheets

(56) References Cited

U.S. PATENT DOCUMENTS

2010/0158437 A1\* 6/2010 Decorby ................ B82Y 20/00
  156/247
2010/0202734 A1   8/2010 DeCorby
2019/0189603 A1\* 6/2019 Wang .................... H01L 23/481

OTHER PUBLICATIONS

Written Opinion on PCT Application No. PCT/US2021/054283 from International Searching Authority (KIPO) dated Feb. 4, 2022.
Bhatnagar, Aparna et al. "Pump-Probe Measurements of CMOS Detector Rise Time in the Blue", Journal of Lightwave Technology, vol. 22, No. 9, Sep. 2004.

\* cited by examiner

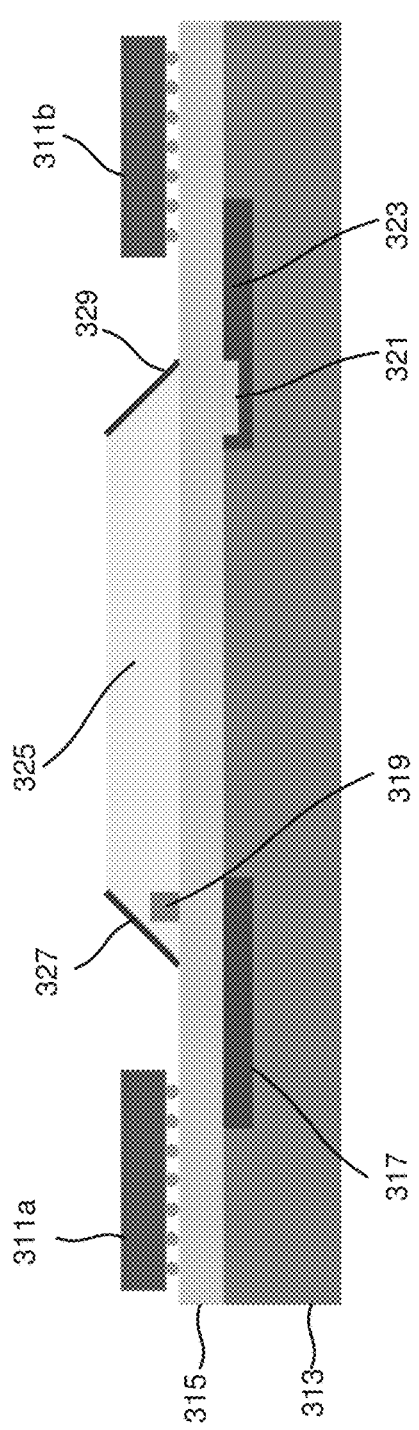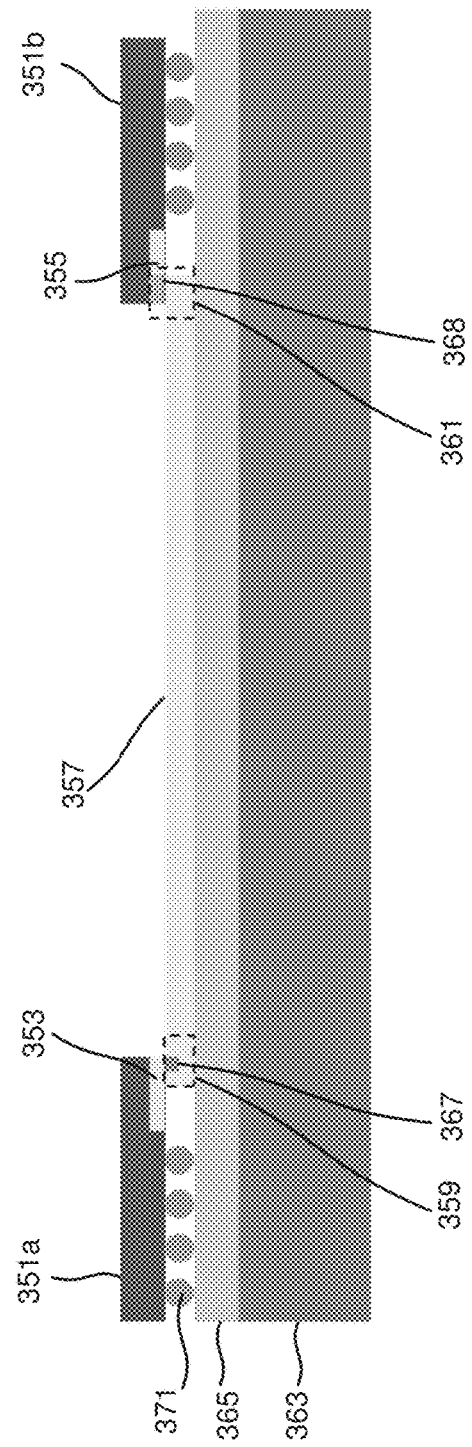

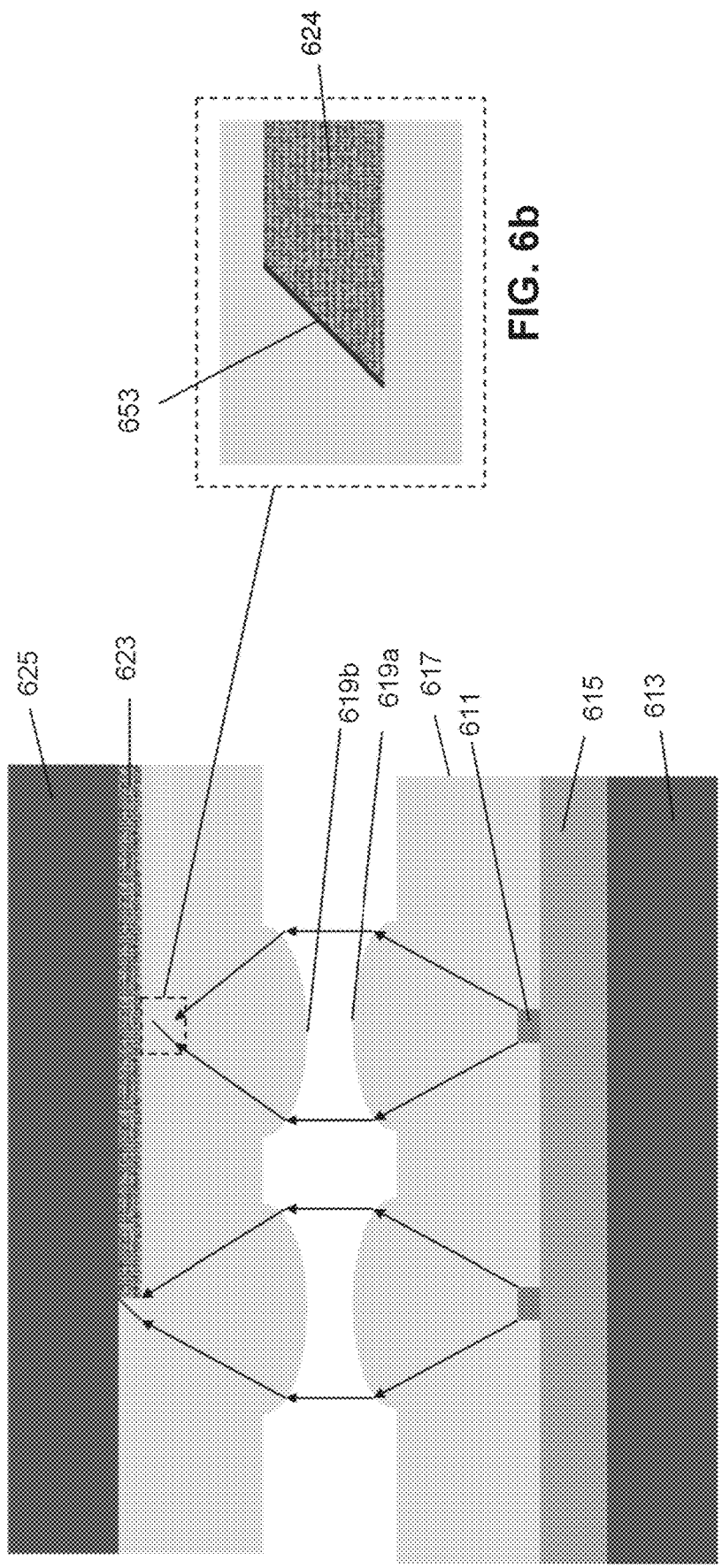

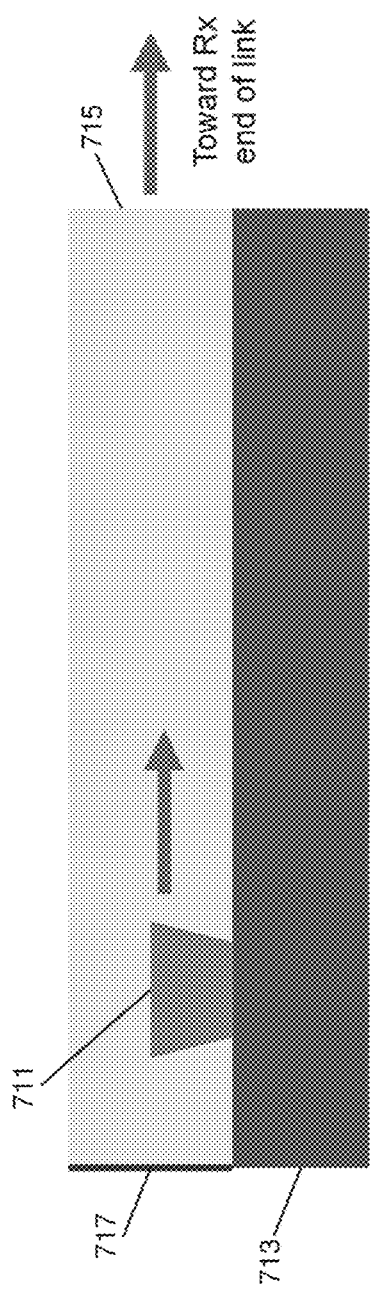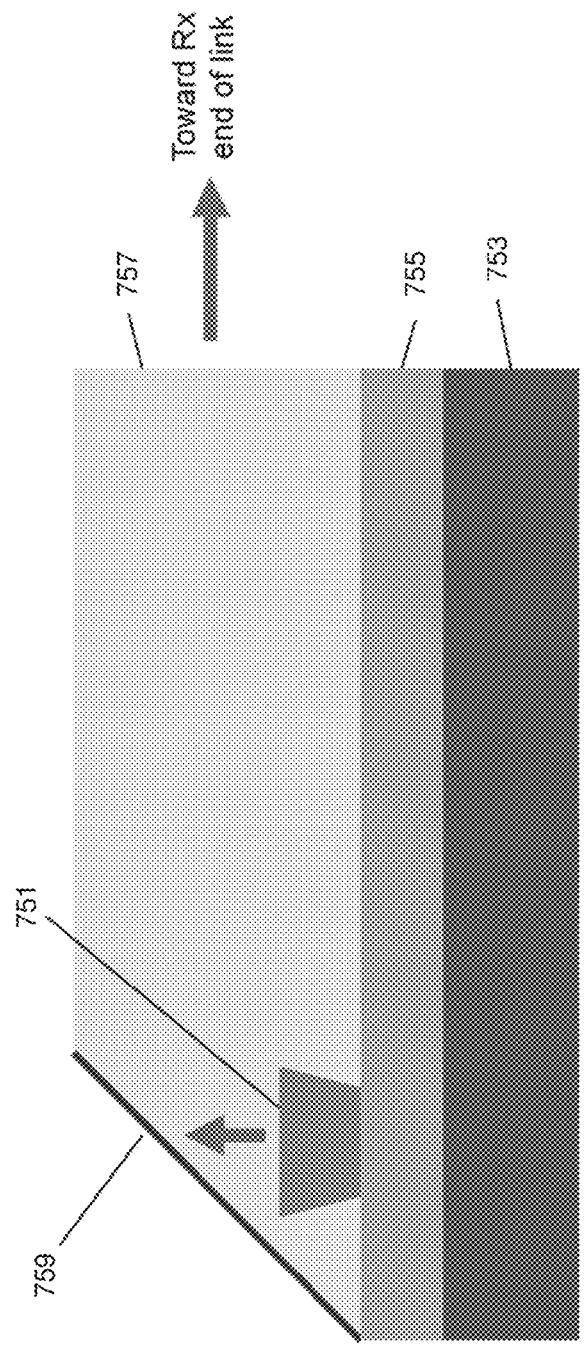

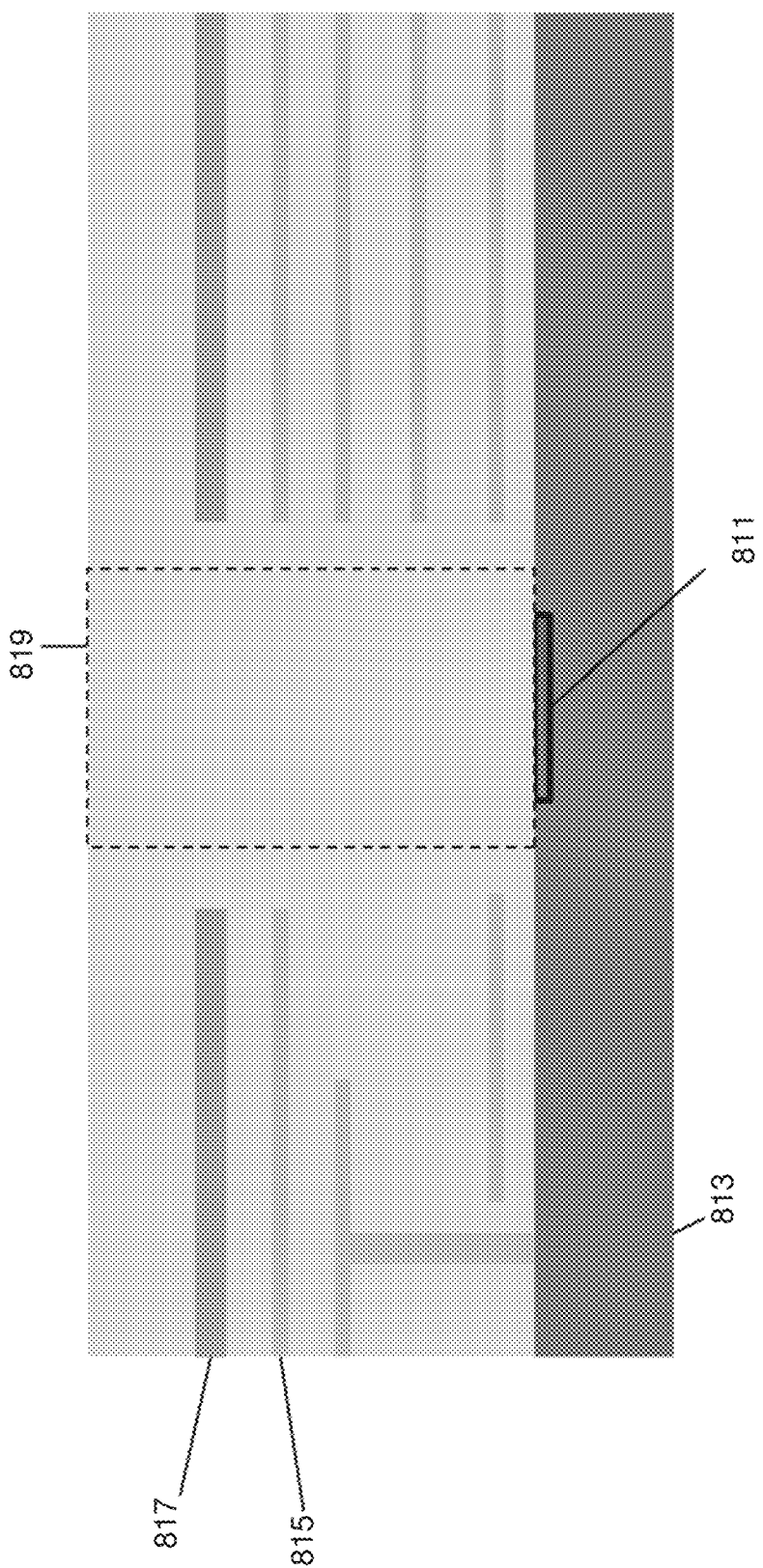

INTEGRATION OF OE DEVICES WITH ICS

CROSS-REFERENCE TO RELATED APPLICATION(S)

This application claims the benefit of U.S. Provisional Patent Application No. 63/089,188, filed on Oct. 8, 2020, the disclosure of which is incorporated by reference herein.

BACKGROUND OF THE INVENTION

The desire for high-performance computing and networking is ubiquitous and ever-increasing. Prominent applications include data center servers, high-performance computing clusters, artificial neural networks, and network switches.

For decades, dramatic integrated circuit performance and cost improvements were driven by shrinking transistor dimensions combined with increasing die sizes, summarized in the famous Moore's Law. Transistor counts in the billions have allowed consolidation onto a single system-on-a-chip of functionality that was previously fragmented across multiple integrated circuits.

However, the benefits of further transistor shrinks are decreasing dramatically as decreasing marginal performance benefits combine with decreased yields and increased per-transistor costs. Independent of these limitations, a single integrated circuit can only contain so much functionality, and that functionality is constrained because the integrated circuit's process cannot be simultaneously optimized for different functionality, e.g. logic, DRAM, and I/O.

In fact, there are significant benefits to "de-integrating" SoCs into smaller "chiplets", including: the process for each chiplet being optimized to its function (e.g. logic, DRAM, high-speed I/O, etc.), chiplets being well-suited to reuse in multiple designs, chiplets being less expensive to design, and chiplets having higher yield because they are smaller with fewer devices.

However, a major drawback to chiplets compared to SoCs is that: chiplets require far more chip-to-chip connections. Compared to the on-chip connections between functional blocks in SoCs, chip-to-chip connections are typically much less dense and require far more power (normalized as energy per bit).

State-of-the-art chip-to-chip interconnects utilizing interposers and bridges, where the chips are flip-chip bonded to a substrate that contains the chip-to-chip electrical traces. While such interconnects provide far higher density and far lower power than interconnects of packaged chips via a printed circuit board, they still fall very far short of what is desired: chip-to-chip interconnects that approach the density and power dissipation of intra-chip interconnects.

The power and maximum distance of electrical interconnects is fundamentally limited by capacitance and conductor resistance. Interconnect density is limited by conductor width and layer count. The capacitance C of short electrical interconnects is proportional to interconnect length and approximately independent of conductor width w (assuming dielectric thickness scales approximately proportionately. The resistance R of electrical connections, and thus the maximum length (limited by RC) is inversely proportional to the conductor cross-sectional area, which scales as $w^2$. The density of electrical connections is inversely proportional to w. Thus, there are trade-offs in interconnect density, length, and power, and these trade-offs are fairly fundamental, being based on dielectric permittivity and conductor (e.g., copper) resistance.

As long as we are limited to electrical interconnects, these fundamental interconnect limitations will constrain system performance and limit what is achievable with so-called "more than Moore" 2.5D and 3D advanced packaging. However, optical interconnects do not suffer from these limitations.

A significant challenge in implementing dense parallel optical chip-to-chip interconnects is integrating the optical transceivers with standard technology.

BRIEF SUMMARY OF THE INVENTION

Some aspects provide an integrated circuit (IC) chip with optical components for an optical interconnect, comprising: a semiconductor substrate containing transistors; a stack of interconnect layers on top of the semiconductor substrate, the interconnect layers including alternating metal and dielectric layers; a microLED on a pad on the stack of interconnect layers, with at least one electrical connection coupling the pad and at least one transistor of the semiconductor substrate; and a photodetector integrated in the semiconductor substrate, with a light passageway to the photodetector through the stack of interconnect layers.

In some aspects the light passageway is provided by the stack of interconnect layers not having metal layers in a region over the photodetector. In some aspects the light passageway is provided by a gap through the stack of interconnect layers in a region over the photodetector. Some aspects further comprise reflectors on edges of the gap. Some aspects further comprise a first waveguide on the stack of interconnect layers, the first waveguide extending over the light passageway to the photodetector through the stack of interconnect layers. Some aspects further comprise an angled reflector at an end of the first waveguide, the angled reflector positioned to reflect light from the waveguide to the photodetector through the stack of interconnect layers. Some aspects further comprise a second waveguide on the stack of interconnect layers, the microLED embedded in the second waveguide. Some aspects further comprise: a further substrate, the further substrate positioned over the microLED; and a waveguide on the further substrate, the waveguide positioned to receive light from the microLED. Some aspects further comprise a reflector, the reflector positioned to direct light from the microLED through the waveguide.

Some aspects provide an optical interconnect for integrated circuit (IC) chips, comprising: a first semiconductor substrate containing transistors; a first stack of interconnect layers on top of the first semiconductor substrate, the interconnect layers including alternating metal and dielectric layers; a microLED on a pad on the first stack of interconnect layers, with at least one electrical connection coupling the pad and at least one transistor of the semiconductor substrate; a second semiconductor substrate containing transistors; a second stack of interconnect layers on top of the second semiconductor substrate, the interconnect layers including alternating metal and dielectric layers; a photodetector integrated in the second semiconductor substrate, with a light passageway to the photodetector through the second stack of interconnect layers; and a waveguide configured to couple light from the microLED to the light passageway to the photodetector through the second stack of interconnect layers.

In some aspects the light passageway is provided by the second stack of interconnect layers not having metal layers in a region over the photodetector. In some aspects the light passageway is provided by a gap through the stack of interconnect layers in a region over the photodetector. Some aspects further comprise reflectors on edges of the gap. Some aspects further comprise: a further substrate, the further substrate positioned over the microLED; and with the waveguide on the further substrate, the waveguide positioned to receive light from the microLED.

Some aspects provide an optical interconnect comprising: a first waveguide and a second waveguide, both on top of an interconnect layer of an integrated circuit (IC) chip, the IC chip including a semiconductor substrate and an interconnect layer on top of the semiconductor substrate; an optical transmitter embedded in the first waveguide, the optical transmitter comprising a microLED having a bottom connected to a pad coupled to a first electrical signal path in the interconnect layer, a top contact of the microLED coupled to a second electrical signal path in the interconnect layer; and a photodetector in the semiconductor substrate of the IC chip, under a level of the interconnect layer, the optical receiver optically coupled to the second waveguide; and wherein a region of the interconnect layer above the photodetector has no metal layers. Some aspects further comprise a first reflector and a second reflector, wherein the first reflector is positioned near a first end of the first waveguide nearest to the microLED, and the second reflector is positioned to optically couple the photodetector and the second waveguide. In some aspects the region of the interconnect layer above the photodetector has no dielectric layers.

These and other aspects of the invention are more fully comprehended upon review of this disclosure.

BRIEF DESCRIPTION OF THE DRAWINGS

FIGS. 3a and 3b illustrate example chip-to-chip optical interconnects, in accordance with aspects of the invention.

FIG. 6a-b illustrates a portion of an example optical interconnect including a separate waveguide assembly, in accordance with aspects of the invention.

FIGS. 7a-b illustrate light propagation from a microLED with respect to a waveguide, in accordance with aspects of the invention.

FIG. 8 is a simplified cross-sectional view of a portion of an example integrated circuit chip with a photodetector, in accordance with aspects of the invention.

DETAILED DESCRIPTION

Some embodiments provide high-speed optical sources, photodetectors, optical waveguides, and optical coupling structures fabricated in a process that is compatible with current integrated circuit fabrication technology. In some embodiments microLEDs are used, and in some embodiments may solve a problem that has long impeded practical short-reach optical interconnects: optical sources with the size and drive power characteristics for short-reach interconnects.

Figure 1:
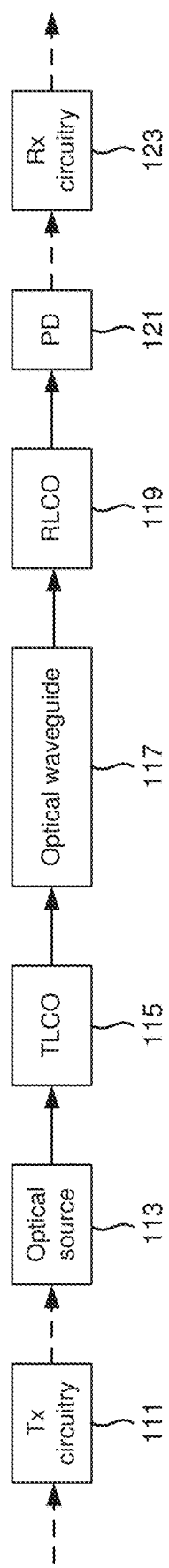
FIG. 1 is a block diagram of an example optical interconnect, in accordance with aspects of the invention.

FIG. 1 shows a block diagram of an example optical interconnect. An input electrical signal is connected to the input of transmitter circuitry 111. An electrical output of the transmitter circuitry drives the input of an optical source 113. The light from the optical output of the optical source is incident on transmitter light collection optics 115, which help to collect the light to maximize coupling efficiency to an optical waveguide 117. Light from the other end of the waveguide is incident on receiver light collection optics 119 that increase or maximize optical coupling efficiency to a photodetector 121. An electrical output of the photodetector is connected to an input of receiver circuitry 123. An electrical output of the receiver circuitry is the output of the optical interconnect.

In some embodiments one or more optical interconnects are used to transport signals from one area of a semiconductor integrated circuit chip to another area of the semiconductor integrated circuit chip. In some embodiments one or more optical interconnects are used to transport signals from one semiconductor integrated circuit chip of a multi-chip module to another semiconductor integrated circuit chip of the multi-chip module. The multi-chip module may, for example contain multiple semiconductor integrated circuit chips within a common semiconductor integrated package. In some embodiments the microLEDs and/or the photodetectors may be mounted on or within the semiconductor integrated circuit chip. In some embodiments the microLEDs and/or the photodetectors may be mounted on or within another chip, for example a chip including microLED driver circuitry and/or signal recovery circuitry.

Figure 2:
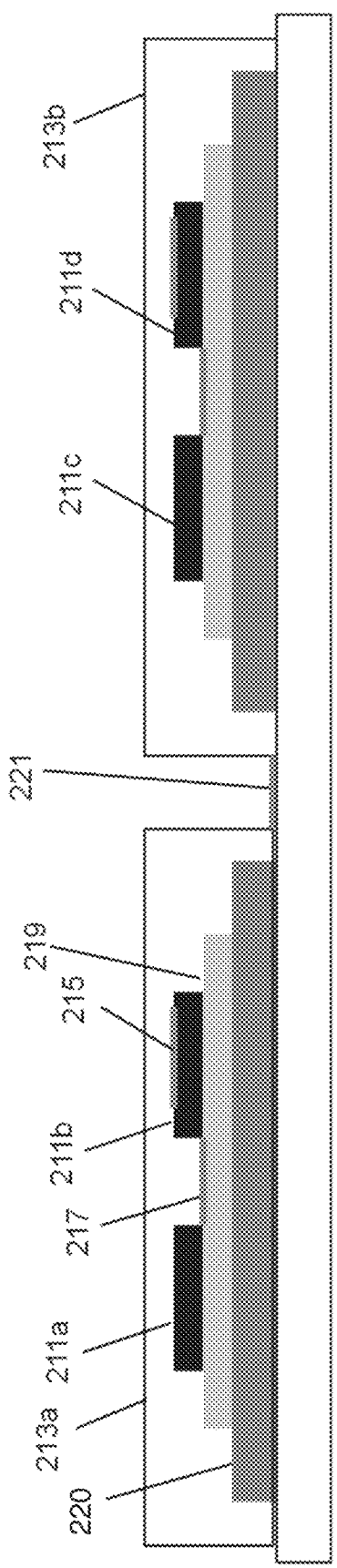
FIG. 2 is a semi-block diagram for a pair of multi-chip modules, with intra-chip optical interconnects, inter-chip intra-module optical interconnects, and inter-module optical interconnects, in accordance with aspects of the invention.

FIG. 2 illustrates in semi-block diagram form a pair of multi-chip modules, with intra-chip optical interconnects, inter-chip intra-module optical interconnects, and inter-module optical interconnects. The optical interconnects generally include a microLED coupled to an IC chip, an optical transmission medium to pass light generated by the microLED, and a photodetector, couple to the same or a different IC chip, to receive the light from the optical transmission medium. The optical interconnects may be, for example, as discussed herein. An optical interconnect therefore can be used at various interconnect levels.

In the example of FIG. 2, a first pair of integrated circuit chips 211a,b are in a first multi-chip module 213a, and a second pair of integrated circuit chips 211c,d are in a second multi-chip module 213b. The pairs of integrated circuit chips may, for example, implement processors or other digital logic circuitry in some embodiments of complex digital logic circuitry and in some embodiments of not so complex digital logic circuitry. In some embodiments, one of the integrated circuits may be a processor integrated circuit while the other integrated circuit may be a memory integrated circuit or a 3D integrated circuit stack comprising a memory controller integrated circuit on top of which multiple memory integrated circuits are stacked, for instance a high bandwidth memory stack. In some embodiments an optical interconnect connects between different areas on the same integrated circuit, e.g., an "intra-integrated circuit interconnect," for example as illustrated by optical interconnects 215 on the integrated circuit chip 211b. Such interconnects can serve as "express lanes," greatly reducing latency compared to an on-chip electronic interconnect, which may require tens of electrical regenerators such as flip-flops (and thus tens of clock cycles of latency) to traverse a large integrated circuit. In some embodiments, thousands of these intra-chip optical interconnects may be used on a single integrated circuit.

In some embodiments, one or more optical interconnects connect between two integrated circuits that are within the same multi-chip module, e.g., an "inter-integrated circuit interconnect." Such is illustrated, for example, by one or more optical interconnects 217 connecting integrated circuit chips 211a,b. In FIG. 2, one or more optical interconnects are shown as being on an interposer 219, which the integrated circuit chips 211a,b are on. In some embodiments, the multi-chip module 213a may not include an interposer; the integrated circuit chips 211a,b may be on a package substrate 220. In such embodiments, one or more optical interconnects may be on or in the package substrate. While only a single inter-integrated circuit optical interconnect is explicitly shown in FIG. 2, in various embodiments each pair of integrated circuit chips may be connected by many thousands of optical interconnects.

In some embodiments, one or more optical interconnects connect between two different modules, e.g. an "inter-module interconnect," by one or more optical interconnects 221 connecting the multi-chip modules 213a,b. In some embodiments, the one or more optical interconnects are on a board or other substrate on which the multi-chip module are mounted.

In some embodiments, the transmitter and receiver circuitry at both ends of one or more optical interconnects are fabricated in a single optical interconnect integrated circuit on a single semiconductor substrate, for instance a silicon, GaAs, GaN, or InP substrate. FIG. 3a illustrates an example chip-to-chip optical interconnect with an optical interconnect with components in or on a single semiconductor substrate. In some embodiments, for example as illustrated in FIG. 3a, the optical waveguides for those optical interconnects are fabricated on that same optical interconnect integrated circuit. In some intra-integrated circuit interconnects, the optical interconnect integrated circuit may also comprise digital logic circuitry for implementing a processor or other complex functionality, or, in some embodiments, not so complex functionality.

Referring to FIG. 3a, in some embodiments of inter-integrated circuit optical interconnects, integrated circuits 311a,b being interconnected are electrically attached to an optical interconnect integrated circuit 313, 315, for instance by solder bumps, micro-bumps, or direct pad-to-pad bonding. In FIG. 3A, data from a first integrated circuit 311a may be passed through integrated circuit interconnect layers 315 of the optical interconnect integrated circuit and provided to transmit circuitry 317 in the semiconductor substrate 313 of the optical interconnect integrated circuit. In some embodiments the data may be processed and/or regenerated by circuitry of the semiconductor substrate on the way to the transmit circuitry. The transmit circuitry drives an optical source, for example a microLED 319, mounted to a one of the integrated circuit interconnect layers of the optical interconnect integrated circuit. Light from the optical source passes through the optical waveguide 325, in some embodiments assisted by transmitter light collection optics. In FIG. 3a, for example, the light collection optics may be comprised of an angled reflector at one end of the optical waveguide. The light in the waveguide is directed by receiver light collection optics 329 to a photodetector 321 in the semiconductor substrate of the optical interconnect integrated circuit. The photodetector is coupled to receive circuitry 323, also in the semiconductor substrate, with the receive circuitry performing at least some of the processing for recovering the data from the first integrated circuit. Signals from the receive circuitry, being either the data from the first integrated circuit or indicative of the data from the first integrated circuit, are passed through the interconnect layers of the optical interconnect integrated circuit (and in some embodiments the semiconductor substrate of the optical interconnect integrated circuit), to a second integrated circuit 311b.

In some embodiments, transmitter circuitry 353 for one or more inter-integrated circuit interconnects is integrated into a first integrated circuit 351a, to which an optical source 367 is attached for each interconnect, for example as illustrated in FIG. 3b. A photodetector 368 and receiver circuitry 355 for each inter-integrated circuit interconnect are integrated into a second integrated circuit 351b. Both integrated circuits may be attached, for instance by solder bumps 371, to a substrate 363 comprising one or more waveguides 357. The transmitter end of each waveguide may comprise transmitter light collection optics 359 and the receiver end of each waveguide may comprise receiver light collection optics 361. The substrate may also comprise electrical connections 365 between the integrated circuits, and may comprise through-substrate vias (TSVs), for instance for the purpose of making electrical connections from the integrated circuits to a package on the opposite side of the substrate. The substrate may be made from a material such as silicon, organic (polymer) material, glass, or ceramic.

In some embodiments the optical transmitters use microLEDs as a light source, a light source being sometimes referred to as an optical source herein. In some embodiments the optical receivers use photodetectors in converting optical signals generated by the microLEDs to electrical signals.

In some embodiments a microLED is made from a p-n junction of a direct-bandgap semiconductor material. In some embodiments a microLED is distinguished from a semiconductor laser (SL) as follows: (1) a microLED does not have an optical resonator structure; (2) the optical output from a microLED is almost completely spontaneous emission, whereas the output from a SL is dominantly stimulated emission; (3) the optical output from a microLED is temporally and spatially incoherent, whereas the output from a SL has significant temporal and spatial coherence; (4) a microLED is designed to be driven down to a zero minimum current, whereas a SL is designed to be driven down to a minimum threshold current, which is typically at least 1 mA.

In some embodiments a microLED is distinguished from a standard LED by (1) having an emitting region of less than 10 µm×10 µm; (2) frequently having cathode and anode contacts on top and bottom surfaces, whereas a standard LED typically has both positive and negative contacts on a single surface; (3) typically being used in large arrays for display and interconnect applications.

Figure 4:
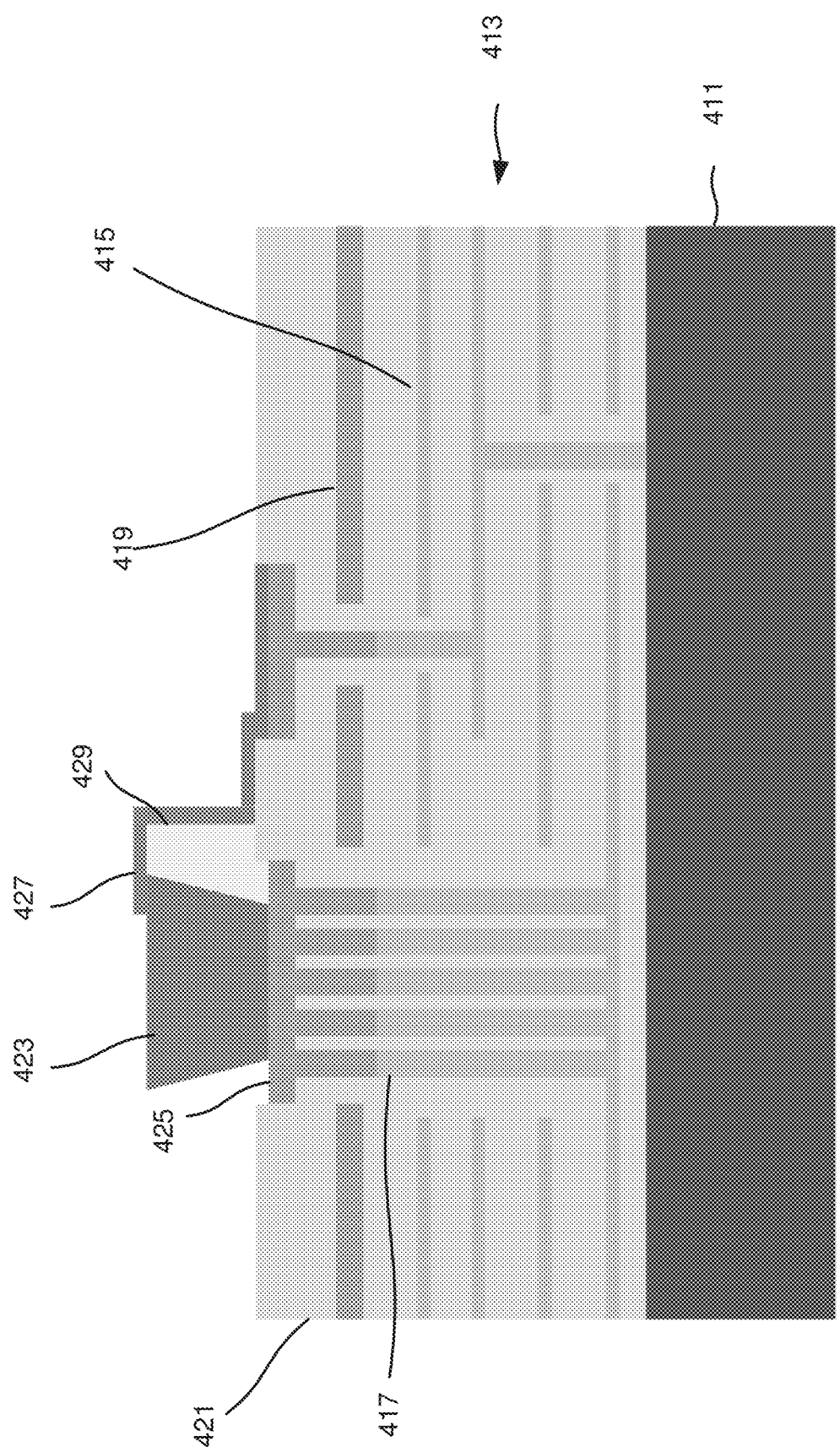
FIG. 4 is a simplified cross-sectional view of a portion of an integrated circuit chip with a microLED, in accordance with aspects of the invention.

In some embodiments, the optical source is bonded to a bonding pad on the surface of an integrated circuit, a partial cross-section of which is shown in FIG. 4. In some embodiments the optical source and integrated circuit of FIG. 4 is the optical source, integrated circuit interconnect layers, and semiconductor substrate of FIG. 3A. In some embodiments the optical source and integrated circuit of FIG. 4 is the optical source and first integrated circuit of FIG. 3b. The integrated circuit comprises a semiconductor substrate 411 containing various devices such as transistors and/or diodes. The integrated circuit also comprises a stack of interconnect layers 413 on top of the substrate, generally comprising alternating metal and dielectric layers. In some embodiments the interconnect layers include aluminum interconnects 419 for higher layers and copper interconnects 415 at lower layers. In some embodiments, a microLED 423 is bonded p-side down to a pad 425 that is part of one of the metal layers in the integrated circuit. In some embodiments, a microLED is bonded n-side down to a pad that is part of one of the metal layers in the integrated circuit. In a further embodiment, the pad to which the microLED is connected to the bottom metal layer by one or more vias 4117 filled with metal such that the thermal resistance between the microLED and the substrate is low. In some embodiments it may be preferred that there be a low thermal resistance path from the microLED to the substrate due to the high current densities at which some microLEDs may be driven (>1000 A/cm² in some cases).

In some embodiments, a metal connection 427 is made from the top contact of the microLED to another pad on the integrated circuit, allowing the microLED to be driven by a voltage across its p-contact and n-contact. Portions of the microLED other than the top contact may be insulated from the metal connection 427 by a dielectric 429.

Figure 5A:
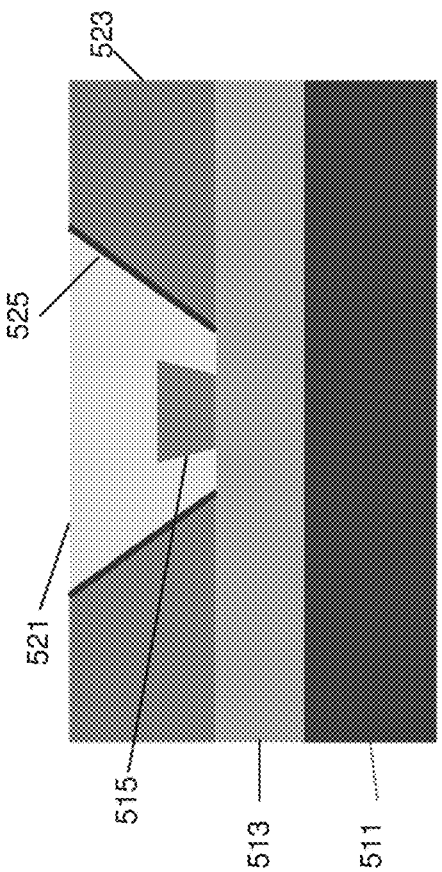
FIGS. 5a-c show examples of microLED optical assemblies, in accordance with aspects of the invention.
Figure 5B:
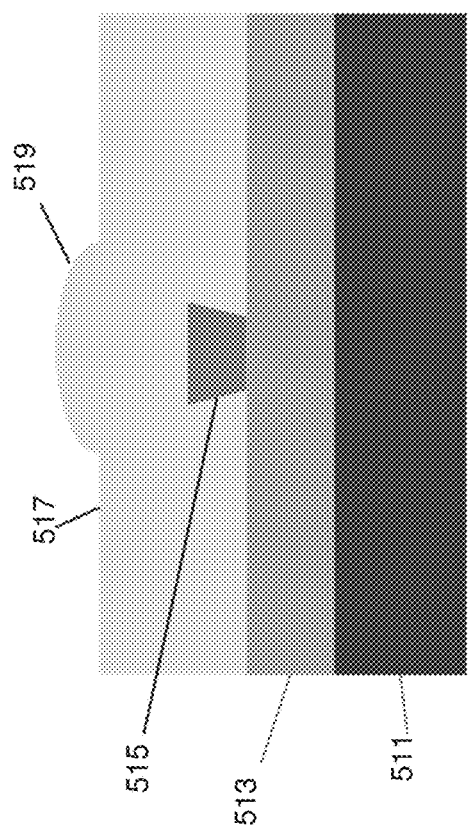
Figure 5C:
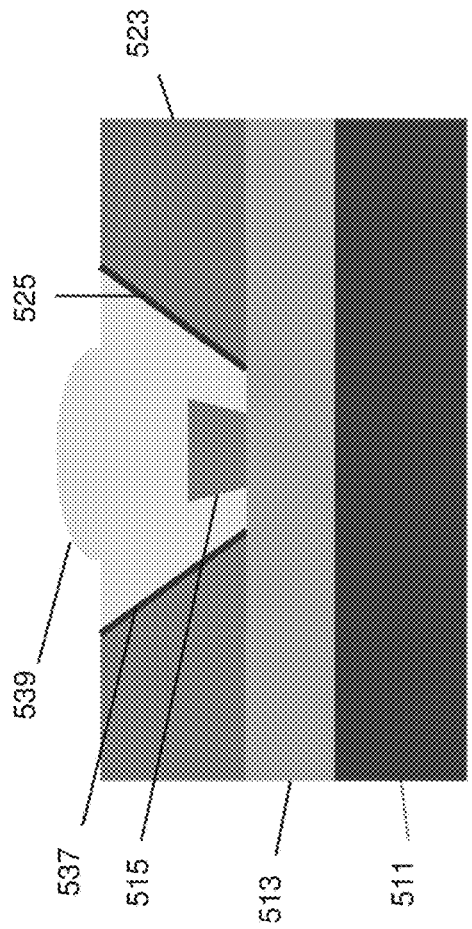

FIG. 5a-c show MicroLED optical assembly embodiments. There are numerous possible embodiments of a MicroLED optical assembly optimized for launching light normal to a microLED surface. In some embodiments, the microLED 515 is mounted to interconnect layers 513 of an IC chip, with the interconnect layers on a silicon substrate 511, in which transistors may have been fabricated. In some embodiments, transmitter light collection optics collect light from the microLED so that angular spread of the light is significantly reduced. In some embodiments, transmitter light collection optics preferentially cause light to propagate in a direction normal to a top surface of the microLED. In some embodiments, as seen in FIG. 5a, the transmitter light collection optics comprise a lens 519 formed from an optically transparent encapsulant 517 that encapsulates the microLED 515. Encasing the microLED in a transparent encapsulant can increase the light extraction efficiency (LEE) from the microLED by reducing the amount of total internal reflection (TIR) within the microLED.

In some embodiments, a reflector structure is fabricated on the top surface of the IC chip. In some embodiments the reflector structure comprises a structure with a sloping surface that is made to be highly reflective, for instance by deposition of a highly reflective metal such as aluminum. In some embodiments, as seen in FIG. 5b, the microLED 515 is on interconnect layers 513 on a substrate 511, as discussed with respect to FIG. 5a. Reflective surfaces 525, 537 slope away from the microLED with increasing distance from the interconnect layers and substrate. In FIG. 5b, the microLED is shown as being in a gap of a dielectric layer 523 on the interconnect layers on the substrate, with the gap increasing in width with distance from the substrate. The reflective surfaces are on the dielectric layer and the gap may be filled with encapsulant 521 to encapsulate the microLED.

The reflector structure is effective in collecting light that is propagating at large angles relative to the microLED surface normal. In some embodiments, the reflector surface is part of a cone of revolution such that a 2D projection is a line. In some embodiments, the reflector surface is part of a parabola of revolution such that a 2D projection is a parabola. In some embodiments, the reflector structure is fabricated by depositing a layer of a dielectric material on the interconnect layers, and then selectively etching away the dielectric to define the surfaces of the reflector.

In some embodiments, the cavity that defines the reflector structure is filled in with an encapsulant that covers the microLED. In further embodiments, a lens is formed at the top of the encapsulant layer filling the reflector cavity such that the collection optics comprise both reflectors and a lens. For example, the embodiment of FIG. 5c includes the structure of the embodiment of FIG. 5b, with the IC chip substrate 511 and interconnect layers 513, along with the microLED, dielectric 523, and reflectors 525, 537. In addition, the embodiment of FIG. 5c includes a lens 539 formed at the top of the encapsulant layer.

In some embodiments, a microLED with associated vertical transmitter light collection optics couple to a separate waveguide assembly comprising a substrate and one or more layers of planar waveguides, for example as discussed with respect to FIG. 3b. In some embodiments, the separate waveguide assembly comprises a lens and/or turning mirror associated with each channel. For example, FIG. 6a shows microLEDs, for example microLED 611, on an interconnect layer 615 on a substrate 613, which may be a silicon substrate of an IC chip. The microLEDs are within an encapsulant layer 617, which includes lenses, for example lens 619a, over the microLEDs (with terms herein such as "over" indicating relative relationships between items in one orientation, it being understood that the actual relationships between items may be reversed, for example if the IC chip is flipped such that the interconnect layer is actually "under" the semiconductor substrate). The lenses focus or collimate light from the microLEDs onto lenses, for example lens 619b, of a separate waveguide assembly. The lenses of the separate waveguide assembly focus the light onto reflectors, for example reflector 653 in the magnified view of FIG. 6b. The reflectors reflect light from the microLEDs into waveguide cores 623 and, as shown in the magnified view of FIG. 6b, 624. The waveguide cores may be axially surrounded by waveguide cladding 621, 651, alone or in combination with a substrate 625 of the separate waveguide assembly.

In some embodiments, the transmitter light collection optics preferentially cause light to propagate in a direction parallel to the microLED's top surface. In some embodiments, the microLED 711 is embedded in a waveguide 715, with both shown on a substrate 713, and the microLED emits light preferentially in the plane of a waveguide, for example as shown in FIG. 7a. A rear reflector 717 may assist in directing light in a forward direction towards a receiver. In some embodiments the microLED 751 emits light preferentially in a direction normal to a top surface of the microLED, for example as illustrated in FIG. 7b, which shows the microLED on an interconnect layer 755 on a substrate 753. An angled reflector 759, at a rear end of the waveguide 757, directs light from the microLED down the waveguide towards a receiver. In some embodiments, the waveguide includes reflector elements that improve optical coupling efficiency down the waveguide toward the detector.

In some embodiments, an IC containing one or more photodetectors has no metal in the interconnect layers over the regions that contain photodetectors. This allows light to propagate from the top surface of the interconnect layers down to the photodetectors that are in the IC substrate. For example, FIG. 8 shows a photodetector, in the form of a photodiode 811, in a top surface of a semiconductor substrate 813. Interconnect layers, for example copper interconnects 815 and aluminum interconnects 817, are generally over the semiconductor substrate. However, in a region 819 over the photodetector, the metal interconnects are absent.

Figure 9:
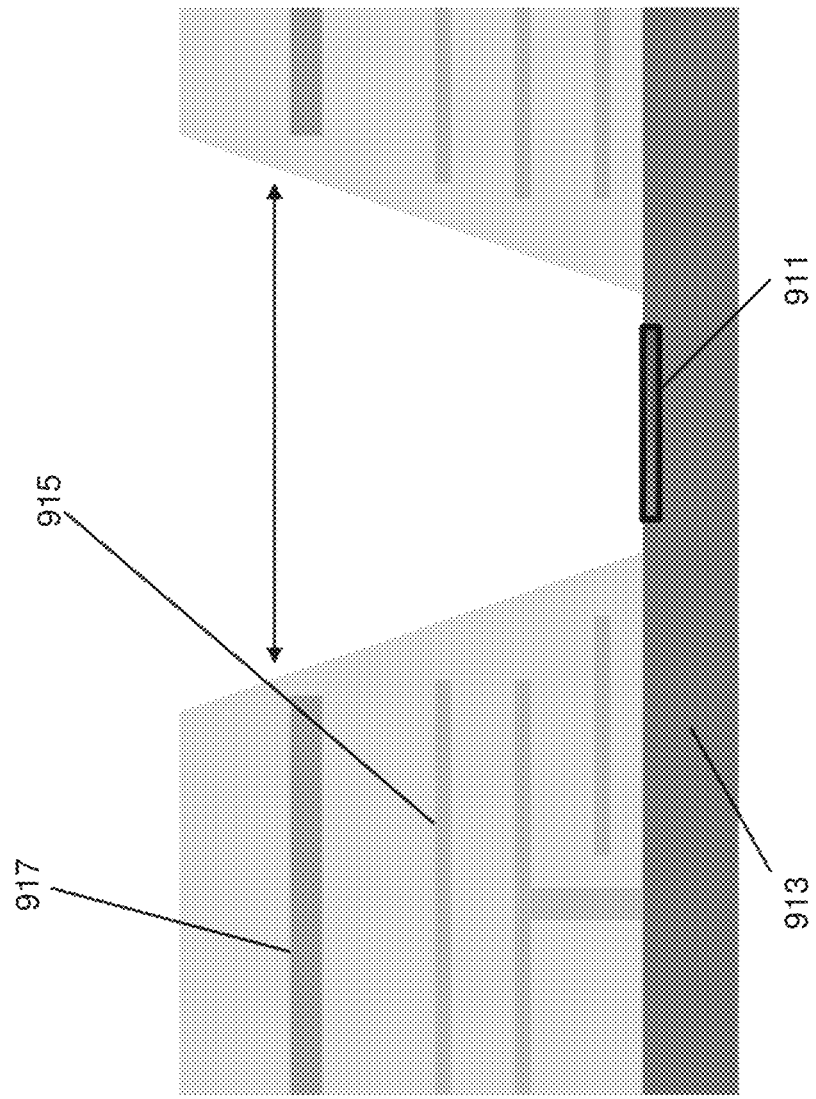
FIG. 9 is a simplified cross-sectional view of a portion of a further example integrated circuit chip with a photodetector, in accordance with aspects of the invention.

In some embodiments, an IC contains one or more photodetectors and the interconnect layers over each photodetector are etched away to expose the photodetectors. This allows light to reach the photodetector without absorption or scattering caused by the intervening interconnect layers. For example, FIG. 9 shows a photodetector, in the form of a photodiode 911, in a top surface of a semiconductor substrate 913. Interconnect layers, for example copper interconnects 915 and aluminum interconnects 917, are generally over the semiconductor substrate. However, in a region over the photodetector, the interconnect layer is absent, for example due to etching. In some further embodiments, this etched region is filled with a transparent encapsulant and a lens is formed on the top surface of the encapsulant. The lens and encapsulant help to direct light normally incident on the surface of the IC to improve collection efficiency by the photodetector.

Figure 10B:
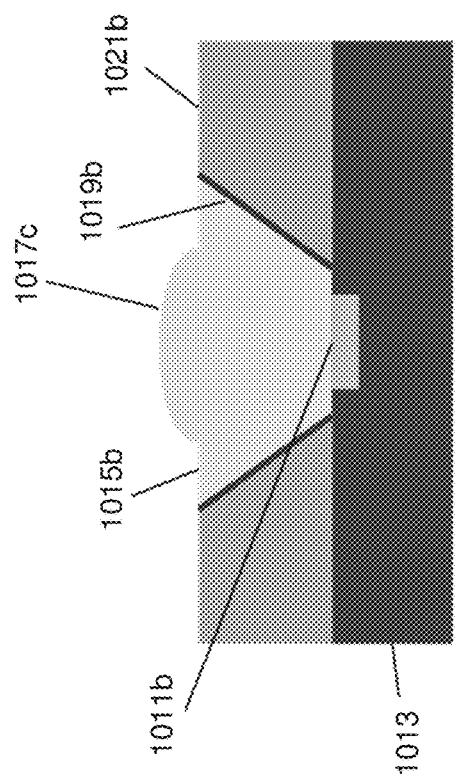
FIGS. 10a-b show examples of photodetector optical assemblies, in accordance with aspects of the invention.
Figure 10A:
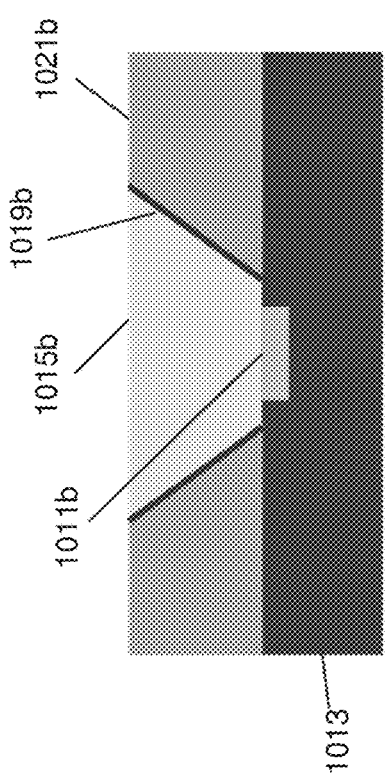

In some embodiments, a reflector structure is fabricated on sloping surfaces etched into the interconnect layers, where the surface is made to be highly reflective, for instance by deposition of a highly reflective metal such as aluminum. FIGS. 10a and 10b show photodetector optical assembly embodiments with reflector structures. The reflector structure is effective in collecting light that is propagating at large angles relative to the photodetector surface normal. In some embodiments, the reflector surface is part of a cone of revolution such that a 2D projection is a line. In some embodiments, the reflector surface is part of a parabola of revolution such that a 2D projection is a parabola. In FIG. 10a, a photodetector 1011b is shown in a semiconductor substrate 1013. A dielectric layer 1021b is over the substrate, other than in a conical volume over the photodetector, the conical volume having a width that increases with height. The conical volume is filled with an encapsulant 1015b. Edges of the dielectric layer abutting the encapsulant have a reflective surface 1019b. In some embodiments, the reflector structure is fabricated by depositing a layer of a dielectric material and then selectively etching away the dielectric to define the surfaces of the reflector. In some embodiments, the cavity that defines the reflector structure is filled in with an encapsulant that covers the photodetector. In further embodiments, a lens is formed at the top of the encapsulant layer filling the reflector cavity such that the collection optics comprise both a reflector and a lens. For example, the embodiment of FIG. 10b includes the structure of the embodiment of FIG. 10A, but additionally includes a lens 1017c formed at the top of the encapsulant layer and over the photodetector.

Figure 11:
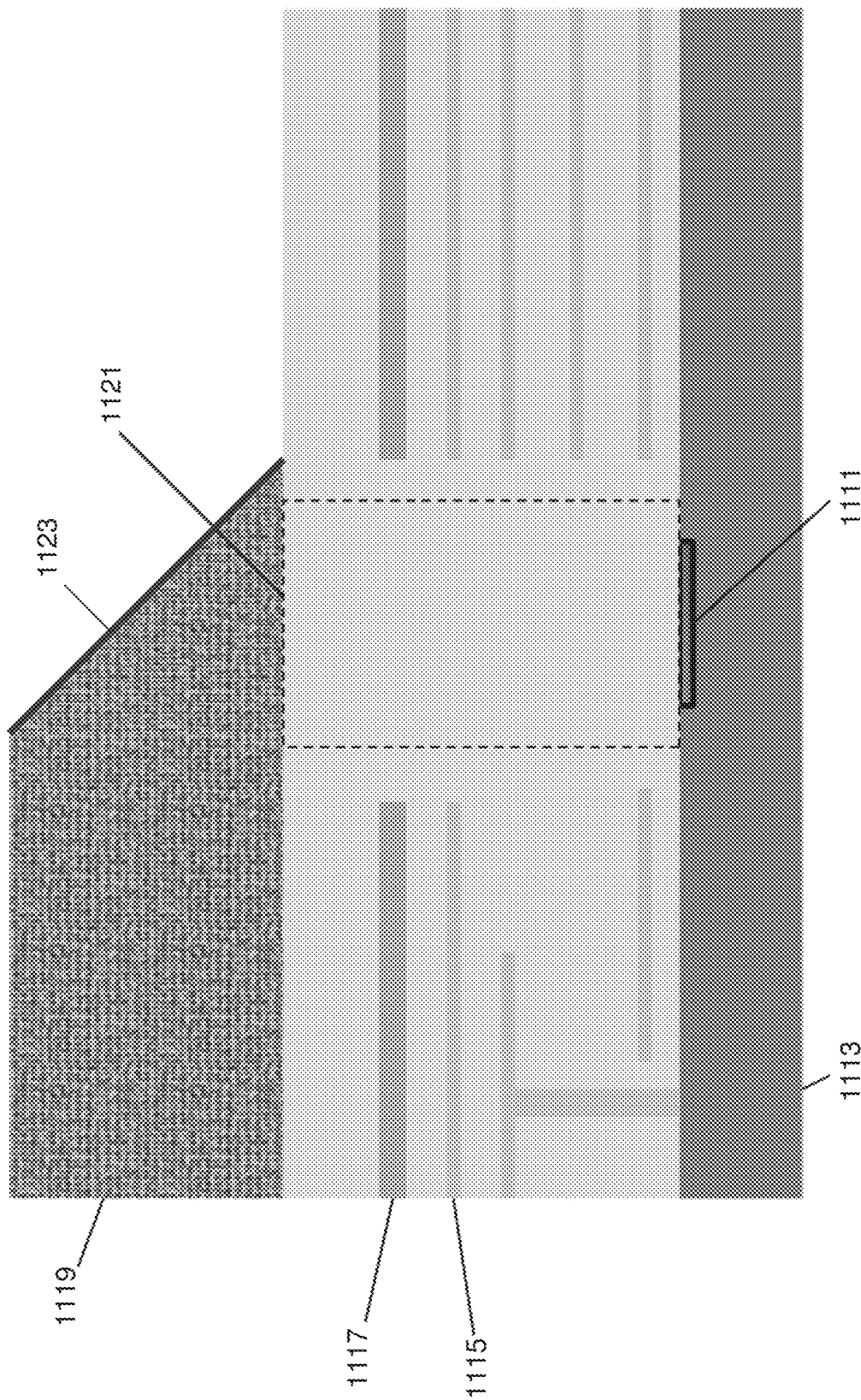
FIG. 11 is a simplified cross-sectional view of a portion of an example integrated circuit chip with a photodetector and a waveguide, in accordance with aspects of the invention.

In some embodiments, for example as illustrated in FIG. 11, an IC has one or more waveguides 1119 on its top surface, and each waveguide includes a turning reflector 1123 that causes the light in the waveguide to propagate down toward a photodiode 1111 that is integrated into a semiconductor substrate 1113. In some embodiments, the IC has no metal 1115, 1117 in the interconnect layers over the regions that contain photodetectors. This allows light to propagate from the IC's top surface down to each photodetector in the IC substrate.

Figure 12:
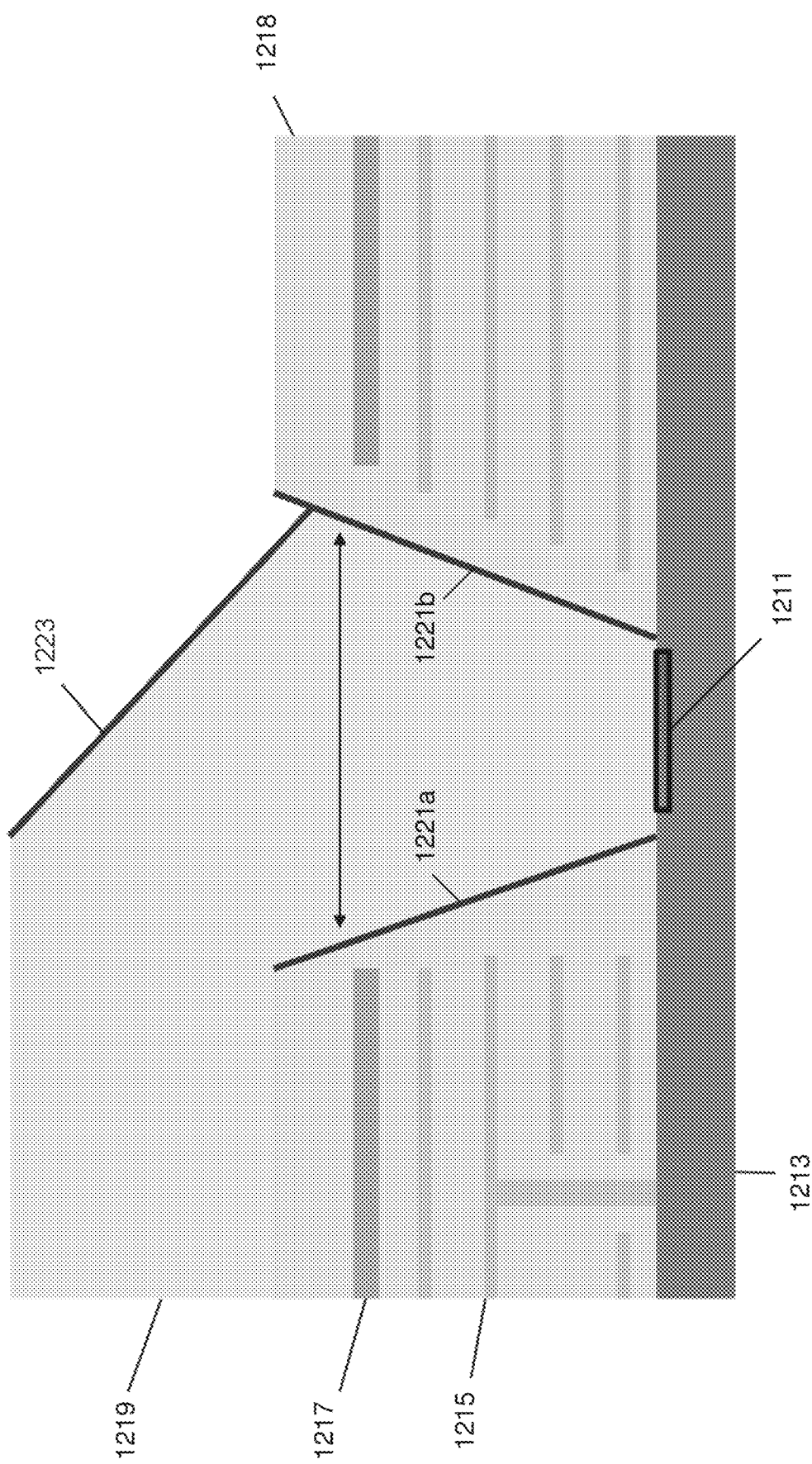
FIG. 12 is a simplified cross-sectional view of a portion of a further example integrated circuit chip with a photodetector and a waveguide, in accordance with aspects of the invention.

In some embodiments, for example as illustrated in FIG. 12, an integrated circuit contains one or more photodetectors 1211 and the interconnect layers, including metal layers 1215, 1217 over each photodetector are etched away to expose the photodetector. This allows light, from a waveguide 1219 and reflected by reflector 1223, to reach the photodetector without absorption or scattering caused by the intervening interconnect layers. In some further embodiments, this etched region is filled with a transparent encapsulant. In some further embodiments, reflectors 1221a,b are formed on the sidewalls of the etched interconnect layers. Both the encapsulant and reflective sidewalls both help to improve light collection efficiency onto the photodetector.

In some embodiments, a photodetector is monolithically integrated with other circuitry on a silicon IC. In some embodiments, the other circuitry comprises analog and/or digital CMOS circuits. In some embodiments, the photodetector structure is fabricated during the same processes used for fabricating the other circuitry. In some embodiments, the photodetector structure is fabricated by post-processing of the wafer after the electrical circuitry is fabricated.

Figure 13A:
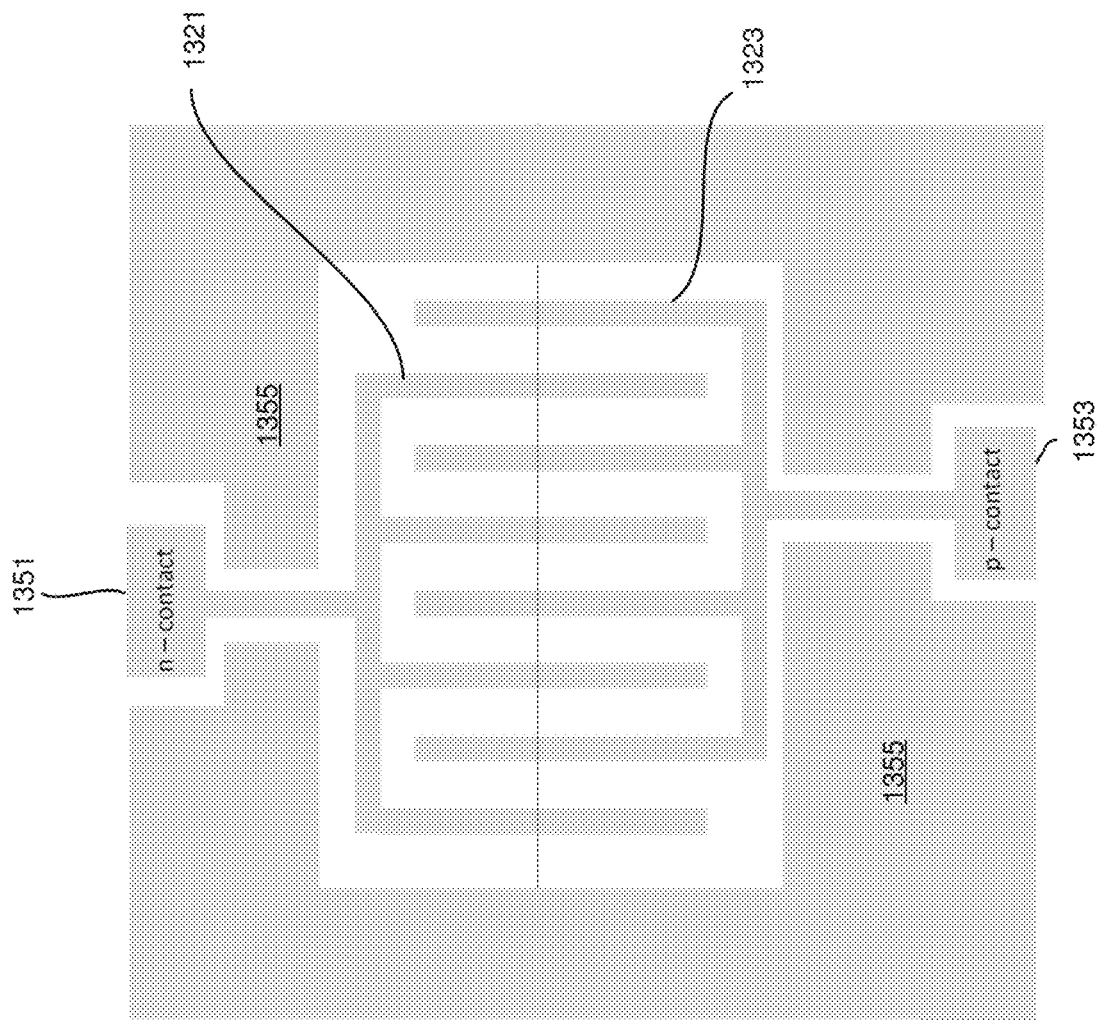
FIGS. 13a-b show a top view and a cross-sectional side view, respectively of an example lateral photodetector, in accordance with aspects of the invention.
Figure 13B:
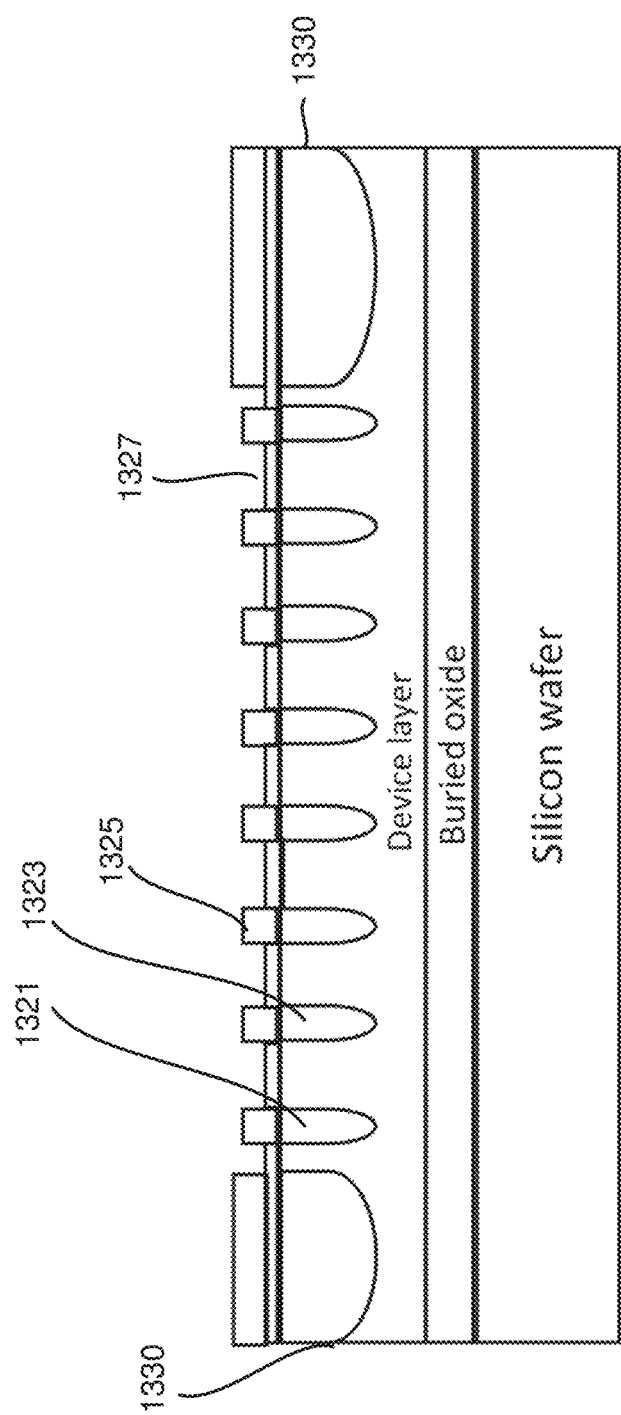

In some embodiments, the photodetector is as discussed in U.S. Provisional Patent Application No. 63/047,694, entitled CMOS-COMPATIBLE SHORT WAVELENGTH PHOTODETECTORS, filed Jul. 2, 2020, the disclosure of which is incorporated by reference herein for all purposes. In some embodiments, the photodetector is a lateral p-i-n structure with the p-i-n diodes being parallel to the substrate surface. In further embodiments, a lateral p-i-n structure comprises interdigitated fingers, with n-wells and p-wells 1330 defined during the same implant/diffusion processes used to fabricate transistors in the substrate. This produces interdigitated contacts of p+ and n+, respectively, with lightly doped semiconductor 1327 in between, and gate oxide above. FIG. 13a shows a top-view and FIG. 13b shows a side cross-sectional view of such a photodetector with a lateral structure. In FIGS. 13a,b a p-contact 1353 is connected to p fingers 1323, which are interdigitated with n fingers 1321 connected to an n-contact 1351. Areas around the finger are shielded by shielding 1355. In some embodiments, the interdigitated contacts are subsequently metalized 1325 with a metal such as copper, gold, or aluminum. In some embodiments, the distance between the fingers is less than 3 um. In some embodiments, the width of each finger is less than 1 um.

In some embodiments, the silicon wafer contains a buried oxide layer 1313 that is typically less than 3 um below the top silicon surface. This can increase the photodetector speed because any carriers generated deep within the wafer are not collected. Such deep carriers tend to slow the photodetector response because the applied electric field that sweeps out the carriers is weaker deep in the silicon.

In some embodiments, the photodetector is a vertical p-i-n structure. In some embodiments, the photodetector is an avalanche photodiode in which current gain is generated by a process in which primary electrons generate additional electrons in an avalanche process.

FIG. 14a-d shows an example of processing to form an example multi-layer waveguide array, in accordance with aspects of the invention. In some embodiments, a planar waveguide is fabricated on the top surface of the interconnect stack of an IC such that the waveguide encapsulates a microLED that has been bonded to the IC. In some embodiments, waveguide core is fabricated on the top surface of the IC interconnect layers with the IC interconnect dielectric serving as a bottom cladding layer.

Figure 14D:
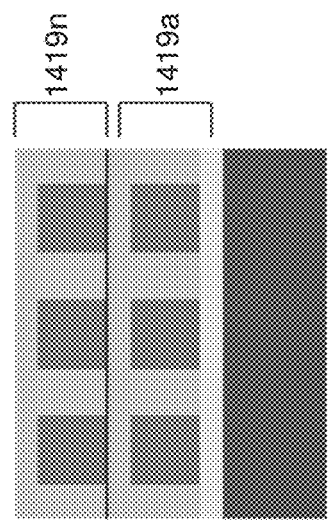
FIG. 14a-d shows an example of processing to form an example multi-layer waveguide array, in accordance with aspects of the invention.
Figure 14C:
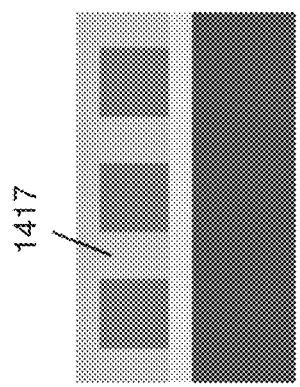
Figure 14B:
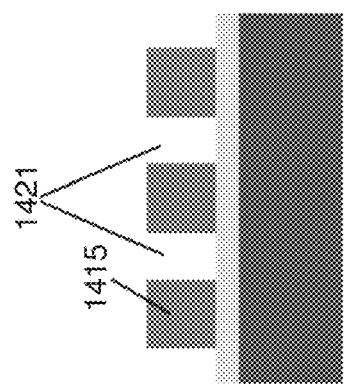
Figure 14A:
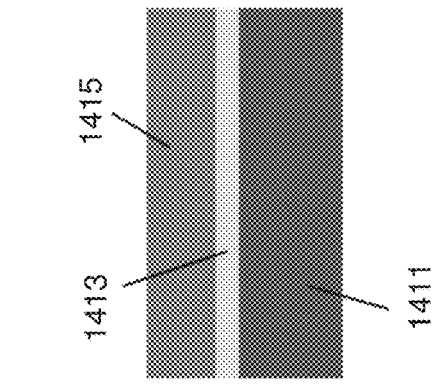

In some embodiments, as seen in FIG. 14a, a bottom cladding layer 1413 is deposited on top of the interconnect layer stack 1411, followed by deposition of a core layer 1415 that is patterned and processed to leave an array of rib waveguides, with spaces 1421 between the ribs, as seen in FIG. 14b. In some embodiments, as seen in FIG. 14c, a fill cladding 1417 is then deposited that serves as the cladding for the sides and top of the waveguides.

In some further embodiments, a subsequent planarization process may be done to the fill cladding of the first waveguide layer to create a planar surface, for instance through a polishing or etching process. In some further embodiments, as seen in FIG. 14d, a second core layer 1419n is deposited and patterned on top of the fill cladding of the first waveguide layer 1419a. In some further embodiments, a fill cladding layer is then deposited that serves as the cladding for the sides and top of the waveguides. In some further embodiments, the previous planarization/core layer/top cladding layer steps are repeated to fabricate layers 2 through N. In some embodiments, the waveguides are as discussed in U.S. Provisional Patent Application No. 63/086,365, entitled MULTI-LAYER PLANAR WAVEGUIDE INTERCONNECTS, filed Oct. 1, 2020, the disclosure of which is incorporated by reference herein for all purposes.

In the subsequent discussion, the term "waveguide" is sometimes used interchangeably with "core" or "waveguide core."

In some embodiments, a planar waveguide is fabricated on the top surface of the interconnect stack of an IC such that the waveguide fills the well that exposes a photodetector; the end of the waveguide comprises an angled reflector that reflects light propagating in the waveguide down into the well so that the light illuminates the photodetector.

In some embodiments, a planar waveguide is fabricated on the top surface of the interconnect stack of an IC such that the waveguide end is positioned over a photodetector, where there is no metal in the interconnect layers over the photodetector; the end of the waveguide comprises an angled reflector that reflects light propagating in the waveguide down into the well so that the light illuminates the photodetector.

Duplex optical waveguide links exploit light propagating in both directions through a waveguide to implement a bidirectional link using a single waveguide. A duplex connection in a single-mode waveguide must utilize elaborate measures such as different wavelengths or circulators must be employed to achieve low loss, high fidelity connections. By contrast, multimode duplex connections can exploit the increase in etendue between a microLED-based transmitter and the etendue at the receiver to implement simple, practical duplex links.

Figure 15C:
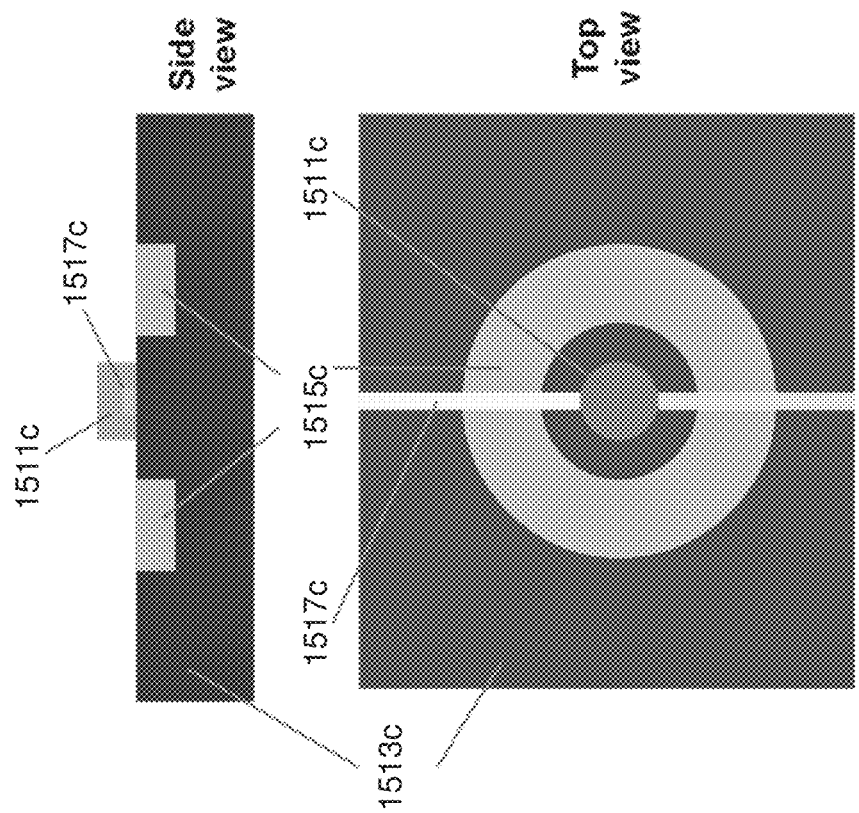
FIG. 15c shows a side and top-view of a duplex transceiver embodiment with a microLED mounted to a substrate within a center of an annular shaped photodetector, in accordance with aspects of the invention.
Figure 15A:
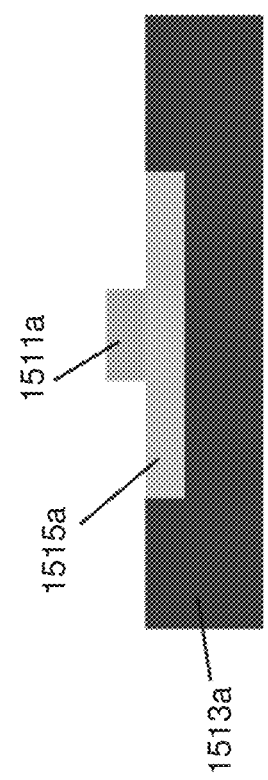
FIG. 15a shows a duplex transceiver embodiment with a microLED mounted to a larger photodetector, in accordance with aspects of the invention.

In a set of embodiments of a duplex transceiver, a microLED is mounted to a substrate in which a photodetector is fabricated. In some embodiments of a duplex transceiver, as seen in FIG. 15a, a microLED 1511a is placed on top of a larger photodetector 1515a that is mounted to a substrate 1513a, where the microLED is wholly over the photodetector. The photodetector, however, includes a detection surface with a larger area than that of the microLED, such that the microLED only covers a portion of the photodetector detection area and the photodetector may receive light on portions of the surface not covered by the microLED. In some embodiments, however, the microLED may partially cover the photodetector and partially cover the substrate. In some embodiments, as seen in FIG. 15c, electrical connections 1517c from transceiver circuitry to the microLED may be made over the top surface of the photodetector. In some embodiments, the photodetector is fabricated in a silicon substrate that also contains transmitter and receiver circuitry.

The light from the microLED can be efficiently coupled into the waveguide via various optical coupling schemes such as those discussed above for microLED optical assemblies, including a lens and/or reflecting optical collector. Light propagating in the waveguide toward the duplex transceiver can be efficiently coupled to the larger photodetector. Received light impinging on the microLED will not be received by the photodetector and therefore contribute to the link loss. However, if the LED area is small compared to the photodetector area and the light is well-distributed across the photodetector, this loss contribution will be small. For instance, if the microLED is 2 um×2 um and the photodetector is 6 um×6 um with the light uniformly distributed across the photodetector, this will cause a loss of $-10*\log 10((6\times6-2\times2)/(6\times6))=0.51$ dB.

Figure 15B:
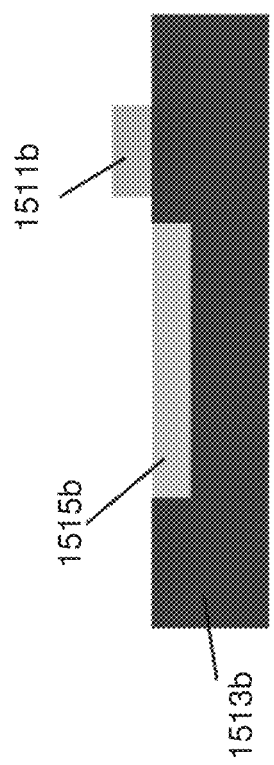
FIG. 15b shows a duplex transceiver embodiment with a microLED mounted to a substrate next to a larger photodetector, in accordance with aspects of the invention.

In some embodiments of a duplex transceiver, as seen in FIG. 15b, a microLED 1511b is mounted next to a larger photodetector 1515b. In some embodiments of a duplex transceiver, as seen in FIG. 15c, a microLED 1511c is mounted to a substrate 1513c where it is surrounded by a photodetector 1515c; for instance, the photodetector may be annular in shape.

In a set of embodiments, duplex microLED/photodetector embodiments can be substituted for microLED-only or photodetector-only embodiments and vice versa.

Although the invention has been discussed with respect to various embodiments, it should be recognized that the invention comprises the novel and non-obvious claims supported by this disclosure.

What is claimed is:

1. An integrated circuit (IC) chip with optical components for an optical interconnect, comprising:
   a semiconductor substrate containing transistors;
   a stack of interconnect layers on top of the semiconductor substrate, the interconnect layers including alternating metal and dielectric layers;
   a microLED on a pad on the stack of interconnect layers, with at least one electrical connection coupling the pad and at least one transistor of the semiconductor substrate; and
   a photodetector integrated in the semiconductor substrate, with a light passageway to the photodetector through the stack of interconnect layers.

2. The IC chip with optical components of claim 1, wherein the light passageway is provided by the stack of interconnect layers not having metal layers in a region over the photodetector.

3. The IC chip with optical components of claim 1, wherein the light passageway is provided by a gap through the stack of interconnect layers in a region over the photodetector.

4. The IC chip with optical components of claim 3, further comprising reflectors on edges of the gap.

5. The IC chip with optical components of claim 1, further comprising a first waveguide on the stack of interconnect layers, the first waveguide extending over the light passageway to the photodetector through the stack of interconnect layers.

6. The IC chip with optical components of claim 5, further comprising an angled reflector at an end of the first waveguide, the angled reflector positioned to reflect light from the waveguide to the photodetector through the stack of interconnect layers.

7. The IC chip with optical components of claim 1, further comprising a second waveguide on the stack of interconnect layers, the microLED embedded in the second waveguide.

8. The IC chip with optical components of claim 1, further comprising:
   a further substrate, the further substrate positioned over the microLED; and
   a waveguide on the further substrate, the waveguide positioned to receive light from the microLED.

9. The IC chip with optical components of claim 8, further comprising a reflector, the reflector positioned to direct light from the microLED through the waveguide.

10. An optical interconnect for integrated circuit (IC) chips, comprising:
   a first semiconductor substrate containing transistors;
   a first stack of interconnect layers on top of the first semiconductor substrate, the interconnect layers including alternating metal and dielectric layers;
   a microLED on a pad on the first stack of interconnect layers, with at least one electrical connection coupling the pad and at least one transistor of the semiconductor substrate;
   a second semiconductor substrate containing transistors;
   a second stack of interconnect layers on top of the second semiconductor substrate, the interconnect layers including alternating metal and dielectric layers;
   a photodetector integrated in the second semiconductor substrate, with a light passageway to the photodetector through the second stack of interconnect layers; and
   a waveguide configured to couple light from the microLED to the light passageway to the photodetector through the second stack of interconnect layers.

11. The optical interconnect of claim 10, wherein the light passageway is provided by the second stack of interconnect layers not having metal layers in a region over the photodetector.

12. The optical interconnect of claim 10, wherein the light passageway is provided by a gap through the stack of interconnect layers in a region over the photodetector.

13. The optical interconnect of claim 12, further comprising reflectors on edges of the gap.

14. The optical interconnect of claim 10, further comprising:
   a further substrate, the further substrate positioned over the microLED;
   with the waveguide on the further substrate, the waveguide positioned to receive light from the microLED.

* * * * *